Figure 4:
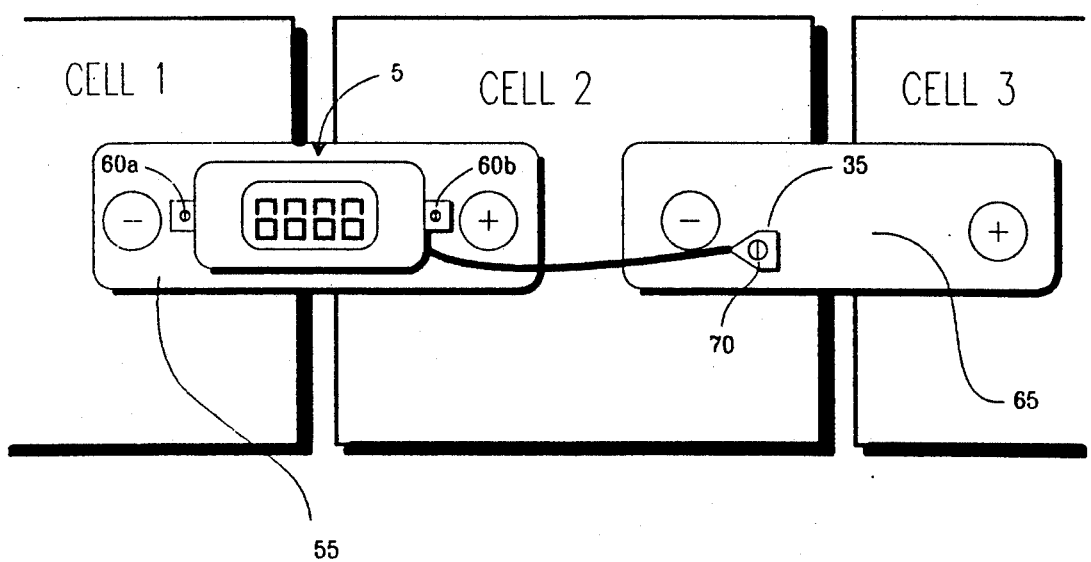

United States Patent [19]

Eaves

[11] Patent Number: 5,136,620
[45] Date of Patent: Aug. 4, 1992

[54] BATTERY CHARGE CYCLE COUNTER

[76] Inventor: Stephen S. Eaves, R.R. 3, Box 1, Millbrook, N.Y. 12545

[21] Appl. No.: 636,141

[22] Filed: Dec. 31, 1990

[51] Int. Cl.$^5$ .......................... G01R 19/14; H02J 7/04
[52] U.S. Cl. ............................................ 377/15; 320/39;
320/48; 324/427; 340/636; 429/61; 429/93;
377/112
[58] Field of Search ............... 377/15, 112; 340/636;
324/427, 437; 429/61, 93; 320/39, 48

[56] References Cited

U.S. PATENT DOCUMENTS

| | | | |
|---|---|---|---|
| 4,024,523 | 10/1975 | Arnold et al. | 340/636 |
| 4,193,026 | 8/1978 | Finger et al. | 324/428 |
| 4,665,370 | 5/1987 | Holland | 340/636 |
| 4,949,046 | 8/1990 | Seyfang | 324/427 |
| 4,965,738 | 10/1990 | Bauer et al. | 340/636 |
| 4,977,393 | 12/1990 | Arnold | 340/636 |
| 5,029,188 | 7/1991 | Lexa | 377/15 |

Primary Examiner—John S. Heyman

[57] ABSTRACT

An electronic counting device for counting the charge cycles accumulated on a battery. The counting device is mounted on a battery intercell connector and senses the reversal in current through the battery which corresponds to a charge cycle.

20 Claims, 4 Drawing Sheets

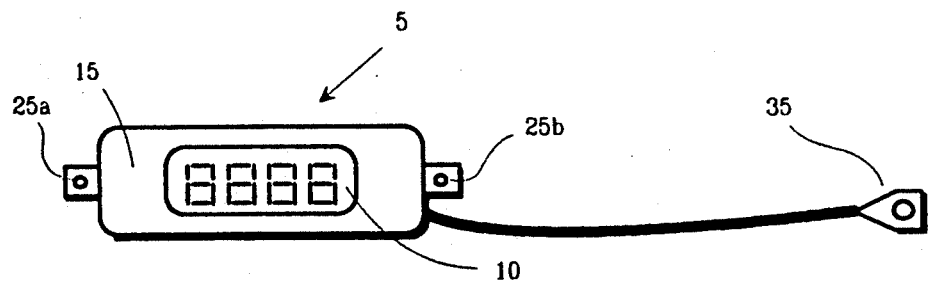
*Fig.* 1
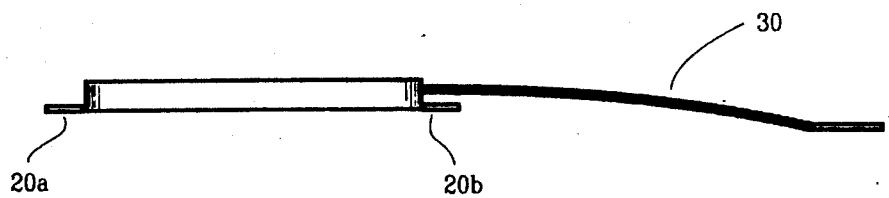
*Fig.* 2
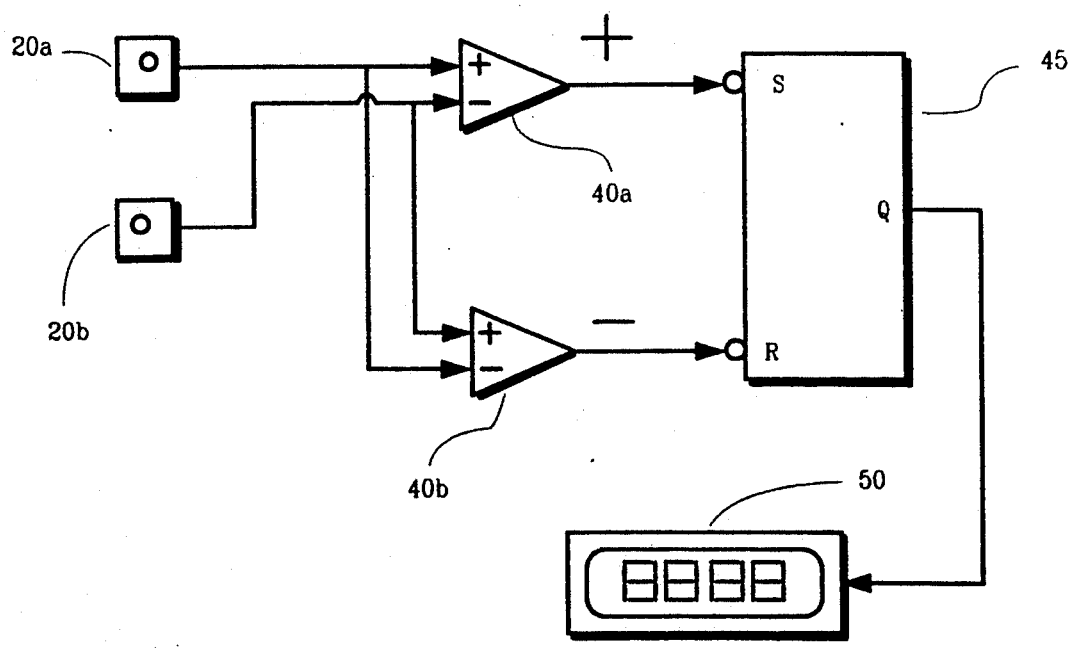
*Fig.* 3

BATTERY CHARGE CYCLE COUNTER

FIELD OF INVENTION

This invention relates to batteries. More specifically it is an electronic counting device which when installed on a battery, counts the number of charge cycles accumulated on it.

BACKGROUND OF INVENTION

When rating the expected life of a rechargeable battery it is the amount of times that a battery can be discharged and charged that determines its life expectancy, this is known as the battery's service life. One discharge and charge of the battery is known as a charge cycle. It is important that when maintaining a battery that proper cycling procedure is used; this means that on the discharge portion of a cycle the battery is drained of its power to the point recommended by the manufacturer, and on the charge portion of a cycle the battery is charged and allowed to cool to the point recommended by the manufacturer. Using proper cycling procedure will maximize the life of a battery.

When maintaining a large number of batteries it becomes important to keep track of how many charge cycles have been used on the batteries. This data is used to monitor how well the batteries are being managed, what their level of usage is, and also to plan for battery replacements in the future.

DESCRIPTION OF PRIOR ART

Although in the past no previously known device is disclosed solely for the measurement of battery charge cycles a number of inventions have been disclosed for the measurement of multiple battery parameters. In U.S. Pat. No. 4,289,836 Lemelson discloses a battery pack with a microprocessor for the measurement of battery parameters which include battery state of charge, number of charge cycles, battery pressure and battery temperature.

Another battery pack with a microprocessor is disclosed by Koenck in U.S. Pat. No. 4,553,081. The microprocessor monitors battery capacity and counts the number of shallow discharges and recharging cycles to estimate battery deterioration. The battery pack of Koenck also includes I/O ports for communication to a portable computer terminal and low power circuitry.

A battery pack is disclosed by Bauer et al. in U.S. Pat. No. 4,965,738 comprising microprocessor based circuitry for monitoring battery parameters. The parameters measured by the invention of Bauer include battery state of charge, battery temperature, battery type and charge cycles. Bauer discloses improvements for minimizing average power consumption and for communicating to an associated battery charger.

Although the above battery packs are useful for the measurements of multiple battery parameters, if the required information only includes charge cycles for an estimate of battery utilization or remaining battery life, the prior art devices required the extra expense, power consumption and complication of microprocessor based circuitry.

In U.S. Pat. No. 5,029,188, Lexa discloses apparatus for measuring the operational cycles of an electrically actuated device. The device of Lexa measures the number of times current is present on a conductor supplying an electrical device such as a valve. Although the device appears similar in design to the device of this invention, the device of Lexa would not function properly when measuring the charge cycles accumulated on a battery. It is required to monitor not only the presence of current but the amount of times that current has reversed direction between charge and discharge. For example, if the device of Lexa was installed to sense the charging current on a battery, and that charger was momentarily turned off then on again, the device of Lexa would incorrectly register the occurrence as a charge cycle even though the battery was never discharged.

SUMMARY OF THE INVENTION

When a battery is being discharged, electrical current flows out of its positive terminal through the load device and back into the battery through its negative terminal. When the battery is being charged, current is forced out of its negative terminal through the charger and back into the battery through its positive terminal. Hence during a transition from being discharged to charged there is a reversal in the direction of current flow through the battery. A convenient method of sensing the current flow in a battery is by measuring the IR drop across one of its intercell connectors. An intercell connector is a conducting strap, bar or wire which connects together the cells in a multi-cell battery. Since an intercell connector has a small electrical resistance, a voltage or IR drop can be measured across two points along its length when current is passed through it. The IR drop is directly related to the magnitude and direction of the current flowing through the battery and hence can be used to detect a charge cycle. Although any conductor which is passing the battery current can be used for this purpose, an intercell connector is readily exposed and easy to attach to.

It is the general object of the invention to sense the occurrence of a charge cycle and provide a visible count which represents the amount of charge cycles accumulated on a battery.

OBJECTS AND ADVANTAGES a) To provide a counting device which can be permanently mounted to a battery intercell connector.

b) To provide a counting device which by sensing the polarity and level of the IR drop across a section of a battery's intercell connector has the means to count the amount of charge cycles accumulated on that battery and provide a visual indication of the count to its user.

c) To provide a counting device which is powered by the battery that it is mounted to eliminating the requirement for external power or batteries.

d) To provide a counting device which will maintain the amount of charge cycles on a battery automatically throughout the battery's life without the effort and errors associated with manual systems.

e) To provide a counting device which by being permanently connected to a battery, and electronically sensing when it is being charged or discharged has the means to improve the reliability and accuracy of recording the battery's charge cycles, hence improving the ability to manage, troubleshoot and properly appropriate batteries.

Further objects and advantages of my invention will become apparent from a consideration of the drawings and ensuing description of it.

DRAWING FIGURES

In the drawings, closely related figures have the same number but different alphabetical suffixes.

Figure 5:
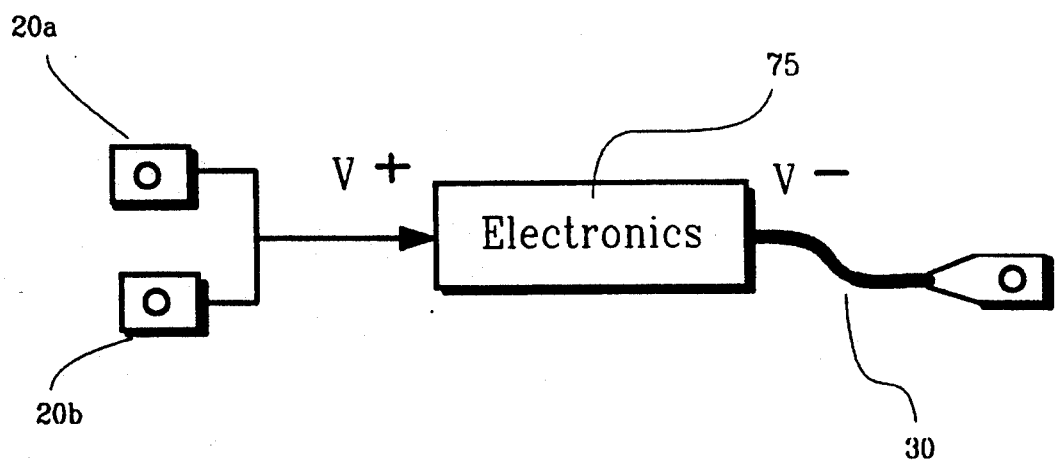
Figure 6:
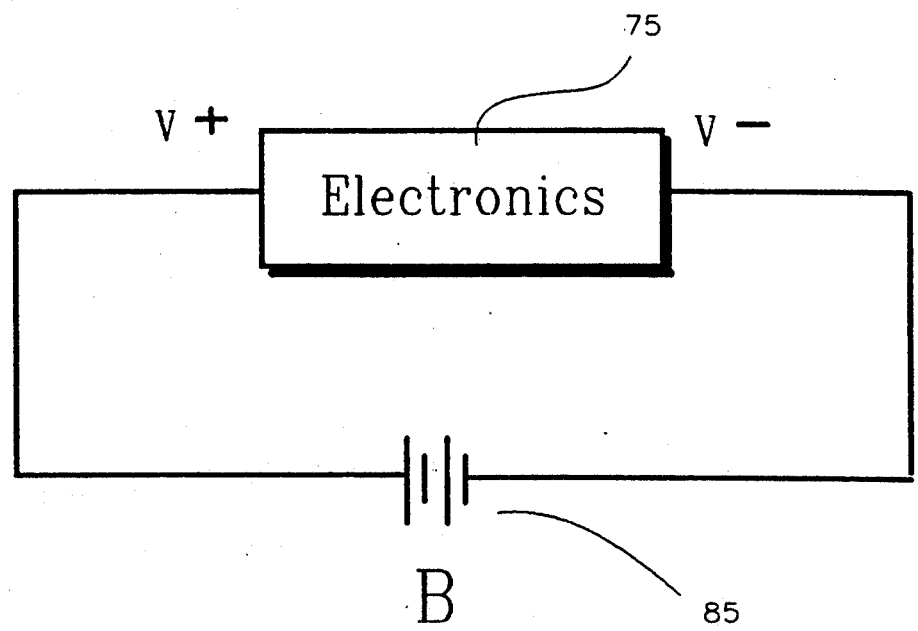
Figure 7:
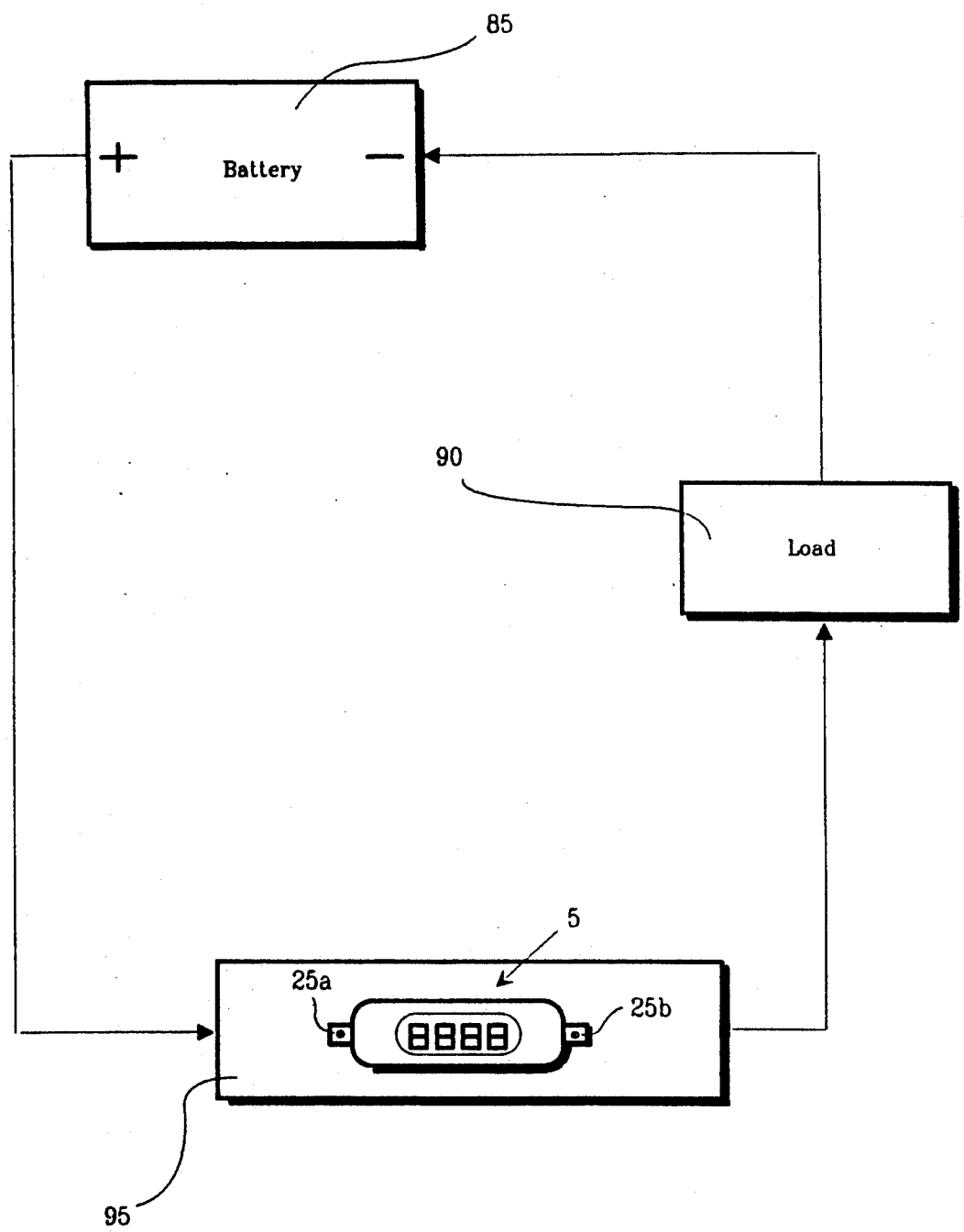

FIG. 1 shows the counting device from above.
FIG. 2 shows the counting device from the side.
FIG. 3 shows a simplified schematic of the electronic portion of the counting device.
FIG. 4 shows the counting device as it would be mounted to a battery intercell connector.
FIG. 5 shows a simplified wiring diagram for powering the counting device.
FIG. 6 shows a simplified wiring diagram of an alternate method for powering the counting device.
FIG. 7 shows an alternate mounting configuration for the counting device.

REFERENCE NUMERALS IN DRAWINGS

| | | | |
|---|---|---|---|
| 10 | digital display | 20a | sensing tab "a" |
| 20b | sensing tab "b" | 25a | mounting hole "a" |
| 25b | mounting hole "b" | 30 | grounding wire |
| 35 | terminal lug | 40a | amplifier "a" |
| 40b | amplifier "b" | 45 | flip-flop |
| 50 | integrated counting and display module | | |
| 55 | intercell connector | 60a | mounting screw "a" |
| 60b | mounting screw "b" | 65 | intercell connector |
| 70 | ground screw | | |
| 75 | counting device electronics | | |
| 80 | internal battery | 85 | monitoring battery |
| 90 | load | 95 | metal plate |

PREFERRED EMBODIMENT

A preferred embodiment of the invention is shown in FIGS. 1 and 2. The counting device 5 consists of a digital display 10 and associated electronics contained in enclosure 15. Two sensing tabs 20a,20b extend out from each end on the bottom of the enclosure. There is a mounting hole 25a,25b in each of the tabs. A grounding wire 30 with terminal lug 35 passes through the side of the enclosure to the counting device electronics inside. FIG. 5 illustrates how grounding wire 30 provides negative supply voltage to the counting device electronics 75, and how sensing tabs 20a,20b provide positive supply voltage.

A simplified schematic of the counter electronics is shown in FIG. 3. The counter electronics consist of a) sensing tabs 20a,20b, b) a polarity detector circuit which is made up of amplifiers 40a,40b and flip-flop 45 and c) an integrated counting and display module 50.

The operation of the invention will now be discussed. FIG. 4 illustrates how the counting device 5 would typically be attached to an intercell connector 55. Screws 60a,60b have been passed through mounting holes 25a,25b and threaded into two points along the length of an intercell connector 55. Grounding wire 30 has been attached to the next intercell connector 65 by threading a ground screw 70 through terminal lug 35. In this implementation a cell voltage of approximately 2 volts is felt between tabs 20a,20b and grounding wire 30. FIG. 5 provides an illustration of how grounding wire 30 provides positive supply voltage and sensing tabs 20a,20b provide negative supply voltage to the counting device electronics 75.

When the battery is charging current flows from left to right through intercell connectors 55,65 in FIG. 4 and produces an IR drop at tab 20a which is positive in respect to tab 20b. During discharge the direction of the current through the intercell connectors is reversed which reverses the polarity of IR drop between tabs 20a,20b.

The circuitry which detects the IR drop between tabs 20a,20b and counts the times it reverses is shown in FIG. 2. Tabs 20a,20b are inputs to amplifiers 40a,40b which are configured in a comparator mode. When no IR drop is present between tabs 20a,20b the output of amplifiers 40a,40b are at a logic "1" state. When the IR drop at tab 20a is positive in respect to tab 20b, amplifier 40a remains at a logic "1" state and amplifier 40b goes to a logic "0" state. When the voltage at tab 20a is negative in respect to tab 20b, amplifier 40b remains at a logic "1" state and amplifier 40a goes to a logic "0" state. A logic "0" from the output of amplifier 40a sets flip-flop 45 causing the output of the flip-flop to go to a logic "1" state. A logic "0" from the output of amplifier 40b resets flip-flop 45 causing its output to go to a logic "0" state. The transition in the output of flip-flop 45 causes integrated counting and display module 50 to increment one count. In this way, the amount of times that the IR drop across tabs 20a and 20b reverses polarity is counted, thereby providing an indication of the charge cycles accumulated on a battery.

ALTERNATE EMBODIMENT

In some instances it may be more convenient to have the counting device powered by its own internal battery. FIG. 6 is a simplified wiring diagram illustrating how an internal battery 80 can be used to provide power to the counting device electronics 75. Note that this eliminates grounding wire 30 illustrated in FIG. 2.

FIG. 7 is an illustration of how the internally powered counting device of FIG. 6 might be attached to a conductor other than an intercell connector. The counting device 5 has been attached to a metal plate 95 which passes the monitored battery's current. The battery current leaves the positive side of the monitored battery 85, passes through metal plate 95, through the load 80, and back into battery 85. Counting device 5 senses the IR drop across metal plate 95 thereby counting the charge cycles as explained earlier in the operational description.

Although the description above contains many specifications, it is merely an illustration of some of the preferred embodiments of this invention and should not be construed as limiting the inventions scope. The scope of the invention should be determined by the appended claims.

I claim:

1. An electronic counting device for counting the charge cycles accumulated on a multicell battery by monitoring for a corresponding reversal in polarity of the IR drop produced across a resistor in series with the cells of said multicell battery, said reversal in polarity resulting from the reversal in current flow through the battery between charge and discharge comprising:

sensing means for sensing the IR drop produced across two points along the length of said resistor in series with the cells of said multicell battery, detecting means for detecting a first condition where said IR drop is of a predetermined polarity and has exceeded a predetermined minimum magnitude and a second condition where said IR drop has reversed from said predetermined polarity and has exceeded a predetermined minimum magnitude, counting means for incrementing a stored count upon a transition from said first condition to said second condition, said counting means thereby accumulating a count equal to the amount of charge cycles accumulated on said multicell battery, display means for providing a visual readout of the amount of charge cycles accumulated by said counting means.

2. The counting device of claim 1 where said sensing means is embodied by two conducting tabs having attachment means for attachment at two points along the length of said resistor in series with the cells of said multicell battery.

3. The detecting means of claim 1 comprising:
a dual comparator circuit means for amplifying said IR drop and for providing a first comparator output signal when said IR drop is of a positive polarity in respect to a reference and has exceeded a threshold level, and a second comparator output signal when said IR drop is of a negative polarity in respect to said reference and has exceeded a threshold level,
a flip-flop circuit means which is latched by said first comparator output signal and unlatched by said second comparator output signal, said flip-flop circuit output serving as the output of said detecting means.

4. The counting device of claim 1 where an intercell connector on said multicell battery serves as said resistor in series with the cells of said multicell battery.

5. The counting device of claim 1 where said counting means and said display means are combined together in an integrated counting and display module.

6. The counting device of claim 1 where means have been provided for presetting said counting means with an initial count, thereby allowing an accurate indication of the charge cycles accumulated on a previously used battery.

7. The counting device of claim 1 where means have been provided for using a portion of said multicell battery's power to provide power to said counting device.

8. The counting device of claim 1 where said counting device is powered by its own internal battery.

9. The counting device of claim 1 where said detecting means, said counting means and said display means are arranged in a single portable housing with said sensing means directly attached thereto.

10. The counting device of claim 9 where said single portable housing is permanently affixed to a portion of said multicell battery, whereby the device will continuously record the charge cycles accumulated on said multicell battery.

11. In a multicell battery having cells serially connected by intercell connectors of a predetermined length, an electronic counting device for counting the charge cycles accumulated on said multicell battery by monitoring for a corresponding reversal in polarity of the IR drop produced across one of said intercell connectors, said reversal in polarity resulting from the reversal in current flow through the battery between charge and discharge comprising;

sensing means for sensing the IR drop produced across two points along the length of said intercell connector, detecting means for detecting a first condition where said IR drop is of a predetermined polarity and has exceeded a predetermined minimum magnitude and a second condition where said IR drop has reversed from said predetermined polarity and has exceeded a predetermined minimum magnitude, counting means for incrementing a stored count upon a transition from said first condition to said second condition, said counting means thereby accumulating a count equal to the amount of charge cycles accumulated on said multicell battery, display means for providing a visual readout of the amount of charge cycles accumulated by said counting means.

12. The detecting means of claim 11 comprising:
a first comparator circuit for providing an output signal when said IR drop is of a positive polarity in respect to a reference and has exceeded a threshold level,
a second comparator circuit for providing an output signal when said IR drop is of a negative polarity in respect to said reference and has exceeded a threshold level,
a flip-flop circuit means which is latched by said first comparator output signal and unlatched by said second comparator output signal, said flip-flop circuit output serving as the output of said detecting means.

13. The counting device of claim 11 where said counting means and said display means are combined together in an integrated counting and display module.

14. The counting device of claim 11 where means have been provided for presetting said counting means with an initial count, thereby allowing an accurate indication of the charge cycles accumulated on a previously used battery.

15. The counting device of claim 11 where means have bee provided for using a portion of said multicell battery's power to provide power to said counting device.

16. The counting device of claim 11 where said counting device is powered by its own internal battery.

17. The counting device of claim 11 where any other resistor connected in series with the cells of said multicell battery is used to generate the IR drop monitored by said counting device.

18. The counting device of claim 11 where said detecting means, said counting means and said display means are arranged in a single portable housing with said sensing means directly attached thereto.

19. The counting device of claim 18 where said single portable housing is permanently affixed to a portion of said multicell battery, whereby said counting device will continuously record the charge cycles accumulated on the battery.

20. The counting device of claim 19 where said sensing means is embodied by two conducting tabs having attachment means for attachment at two points along the length of said intercell connector and where the tabs serve an added function as means for permanently affixing said counting device to said multicell battery.

* * * * *